United States Patent
Wu et al.

(10) Patent No.: US 10,116,105 B2
(45) Date of Patent: Oct. 30, 2018

(54) ILLUMINATED PRINTED CIRCUIT BOARDS FOR CONNECTORS

(71) Applicant: Apple Inc., Cupertino, CA (US)

(72) Inventors: Chia Chi Wu, Taipei (TW); Zhengyu Li, Shanghai (CN); Zheng Gao, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/242,603

(22) Filed: Aug. 22, 2016

(65) Prior Publication Data

US 2017/0133800 A1    May 11, 2017

Related U.S. Application Data

(60) Provisional application No. 62/208,470, filed on Aug. 21, 2015.

(51) Int. Cl.
| | |
|---|---|
| *G08B 5/00* | (2006.01) |
| *H01R 13/717* | (2006.01) |
| *H01R 24/60* | (2011.01) |
| *G02B 6/00* | (2006.01) |
| *H05K 1/18* | (2006.01) |

(52) U.S. Cl.
CPC .......... *H01R 13/7175* (2013.01); *G02B 6/00* (2013.01); *H01R 13/7172* (2013.01); *H01R 24/60* (2013.01); *H05K 1/18* (2013.01)

(58) Field of Classification Search
CPC ........ G09F 9/305; G09F 9/33; F21Y 2101/02; G08B 5/36; H01R 13/7175; H01R 13/717; H01R 13/6641

USPC .............................. 340/815.42; 362/557, 555
See application file for complete search history.

(56) References Cited

U.S. PATENT DOCUMENTS

| | | | | |
|---|---|---|---|---|
| 5,790,041 A * | 8/1998 | Lee | ...................... | H01R 13/713 340/815.42 |
| 7,094,074 B2 * | 8/2006 | Chiou | .............. | G06K 19/07732 439/607.41 |
| 8,638,233 B2 * | 1/2014 | Aguren | ................ | G02B 6/4246 340/815.42 |
| 9,160,118 B2 * | 10/2015 | Tuchrelo | .............. | H01R 13/665 |
| 9,461,417 B2 * | 10/2016 | Zhang | ................ | H01R 13/7175 |

(Continued)

*Primary Examiner* — Hien Vu
(74) *Attorney, Agent, or Firm* — Kilpatrick Townsend & Stockton, LLP

(57) ABSTRACT

Connectors that may provide illumination at an opening in order to facilitate the mating to a corresponding connector by a user. The illumination may be generated on a tongue of a connector insert or in a connector receptacle. For connector receptacles, illumination may be guided to illuminate an opening of the connector receptacle, it may be guided out of a front edge of a tongue in the connector receptacle, or it may be guided in other directions. For connector inserts, illumination may be out of a front edge or sides of a tongue in the connector insert, or it may be guided in other directions. The illumination may be colored or patterned to convey information to a user. Other examples may include a connector system having a connector insert with a light guide to provide illumination from a connector receptacle to an opening in the connector insert where it may be viewed by a user. In other examples, other types of data, such as authentication or identification data, may be optically transmitted either to or through a connector insert inserted in the connector receptacle.

21 Claims, 11 Drawing Sheets

(56) References Cited

U.S. PATENT DOCUMENTS

| | | |
|---|---|---|
| 9,612,391 B2 * | 4/2017 | Wu .................. G02B 6/0075 |
| 9,660,395 B2 * | 5/2017 | Yeom ................ H01R 13/7172 |
| 2009/0267785 A1 | 10/2009 | Ritzau |
| 2011/0300749 A1 * | 12/2011 | Sytsma ............ H01R 13/65802 439/607.01 |
| 2013/0201001 A1 | 8/2013 | Ratnakar |
| 2013/0267120 A1 | 10/2013 | Rothkopf |
| 2014/0112005 A1 | 4/2014 | Chen |
| 2015/0017831 A1 | 1/2015 | Wang |
| 2015/0349847 A1 | 12/2015 | Hassan-Ali |
| 2016/0020557 A1 | 1/2016 | Daoura |
| 2016/0039297 A1 | 2/2016 | Kretschmer |
| 2017/0051902 A1 | 2/2017 | Rodriguez |

* cited by examiner

ILLUMINATED PRINTED CIRCUIT BOARDS FOR CONNECTORS

CROSS REFERENCE TO RELATED APPLICATIONS

The present application claims the benefit of U.S. provisional application No. 62/208,470, filed Aug. 21, 2015, which is hereby incorporated by reference.

BACKGROUND

The amount of data transferred between electronic devices has grown tremendously the last several years. Large amounts of audio, streaming video, text, and other types of data content are now regularly transferred among desktop and portable computers, media devices, handheld media devices, displays, storage devices, and other types of electronic devices. Power may be transferred with this data, or power may be transferred separately.

Power and data may be conveyed over cables that may include wire conductors, fiber optic cables, or some combination of these or other conductors. Cable assemblies may include a connector insert at each end of a cable, though other cable assemblies may be connected or tethered to an electronic device in a dedicated manner. The connector inserts may be inserted into connector receptacles in the communicating electronic devices to form pathways for power and data.

But it may not always be a simple task for a user to insert a connector insert into a connector receptacle on an electronic device. For example, a user may be in a dark bedroom at night and may want to insert a connector insert into a connector receptacle on an electronic device. It may be undesirable to turn on a light, for example such illumination may disturb someone else in the room.

Also, it may be difficult to tell a status of an electronic device just by observation. For example, it may be difficult to tell if a battery is charged or if the electronic device is in a silent or sleep mode.

Further, once a connector insert is inserted, it may be difficult to determine if the connector insert has made an electrical connection with the connector receptacle. This may be particularly true when audible prompts have been disabled for the electronic device.

Thus, what is needed are connectors that facilitate the mating of corresponding connectors, particularly when ambient lighting is limited. It may also be desirable that status information for a device housing a connector receptacle may be easily determined.

SUMMARY

Accordingly, embodiments of the present invention may provide connectors that facilitate the mating of corresponding connectors, particularly when ambient lighting is limited.

An illustrative embodiment of the present invention may provide illumination at a connector receptacle in order to facilitate the insertion of a connector insert by a user. The illumination may be generated on a tongue in the connector receptacle. The illumination may be directed in a manner to illuminate an opening of the connector receptacle, it may be guided out of a front edge of a tongue in the connector receptacle, or it may be directed in other directions.

Another illustrative embodiment of the present invention may provide illumination at a connector insert in order to facilitate its insertion into a connector receptacle. The illumination may be generated on a tongue of the connector insert. The illumination may be directed in a manner to illuminate a front edge of a connector insert, or it may be directed in other directions.

An illustrative embodiment of the present invention may provide a connector having a tongue supporting a number of contacts to form electrical pathways with corresponding contacts in a corresponding connector. The tongue may include a recess or opening for supporting a light-emitting diode (LED). The tongue may be at least substantially transparent or translucent such that it may act as a light pipe or light guide. Light emitted by the LED may be directed out a front of edge of the tongue. The tongue may be formed of an epoxy, such as optical epoxy, or other appropriate material. The tongue may be formed as a printed circuit board having glass fibers, where the glass fibers are at least substantially transparent or translucent and aligned to form light paths from the LED to a front edge of the tongue. The front or other edges of the tongue may be partially plated for functional reasons, for example to form a ground path. The front or other edges of the tongue may be plated for aesthetic reasons, for example to form a logo or other identifying mark. In connector receptacles having this configuration, the front of the tongue, the connector receptacle opening, or both may be illuminated by the LED. In connector inserts having this configuration, the front of the connector insert, the other surfaces of the connector insert, or both, may be illuminated by an LED.

Another illustrative embodiment of the present invention may provide a connector that may include a tongue supporting a number of contacts to form electrical pathways with corresponding contacts in a corresponding connector. The tongue may include a recess or opening for supporting a light-emitting diode. The tongue may be clad in copper or other opaque material. An illumination window may be formed as an opening in either or both a top and bottom side of the tongue. A center layer of the tongue may be at least substantially transparent or translucent such that it may act as a light pipe or light guide. Light emitted by the LED may be directed out the illumination window or windows on the tongue. One or more diffusers may be located in the illumination window or windows to diffuse light from the LED to provide a more uniform illumination. These diffusers may be formed of glass, plastic, or other at least substantially transparent or translucent material. The tongue may be formed of an epoxy, such as optical epoxy, or other appropriate material. The tongue may be formed as a printed circuit board having glass fibers, where the glass fibers are at least substantially transparent or translucent and aligned and curved to form light paths from the LED to the one or more illumination windows. The illumination windows on the tongue may be plated for aesthetic reasons, for example to form a logo or other identifying mark. In connector receptacles having this configuration, the front of the tongue, the connector receptacle opening, or both may be illuminated by the LED. In connector inserts having this configuration, the front of the connector insert, the other surfaces of the connector insert, or both, may be illuminated by an LED. In various embodiments of the present invention, the LED illumination may remain on, or it may be triggered by an event, such by the connector being moved.

In these or other embodiments of the present invention, one or more LEDs may be included in, on, or proximate to a tongue for a connector receptacle or a connector insert. The illumination provided by these one or more LEDs may convey visual information to a user. The visual information may be provided to a user through a particular color of light, by a particular sequence of a light pulses, by a sequence of various colors turning off and on, or some combination thereof. For example, a particular color or pattern of light may mean that the electronic device housing a connector receptacle may have a battery that is charged above a threshold level, is presently being charged, is charged below the threshold level, or has some other charge or charging status. In this and other embodiments of the present invention, a particular color or pattern of light may mean that the electronic device is in a sleep mode, a silent mode, or is in some other particular state.

In these and other embodiments of the present invention, it may be desirable that this information or other information be visible to a user when a connector insert is inserted into a connector receptacle. Accordingly, embodiments of the present invention may provide a connector system. The connector system may include a device having a connector receptacle. The connector receptacle may include a tongue supporting a number of contacts to form electrical pathways with corresponding contacts in a connector insert. The tongue may include a recess for supporting one or more light-emitting diodes. The tongue may be at least substantially transparent or translucent such that it may act as a light pipe or light guide. Light emitted by the one or more LEDs may be directed out a front of edge of the tongue. The connector system may further include a connector insert. The connector insert may further include a light pipe to receive light from the front edge of the tongue and direct it to an opening on the connector insert where it may be visible to a user. In this way, charging information, status information, or other information provided by the electronic device on the connector receptacle tongue may be visible to a user when a connector insert is inserted into the connector receptacle. In a specific embodiment of the present invention, circuitry in the electronic device may detect that a connector insert has been mated with the connector receptacle. The circuitry may drive the one or more LEDs to a color or pattern that indicates the connector insert has been mated to the connector receptacle. This may then be visible to a user to confirm that a connection has been made.

In these and other embodiments of the present invention, other types of data may be conveyed using this or similar connector systems. For example, authentication, identification, or other types of information or data may be transmitted between an electronic device housing the connector receptacle and a remote circuit. The remote circuit may be located in a connector insert that is inserted into the connector receptacle, a connector insert at a far end of a cable attached to the connector insert, in a device connected to the electronic device through such a cable, or elsewhere in the cable. In one specific example, the connector receptacle may be a connector receptacle for a standardized interface, for example a Universal Serial Bus (USB) interface, such as a USB-C or other USB interface. The light path through the connector system may be an optional back-channel data path for devices made by a particular manufacturer or group of manufacturers. Again, data such as authentication, identification, or other types of information or data may be transmitted between devices made by a particular manufacturer or group of manufacturers. In these and other embodiments of the present invention, a first device may recognize that a remote device may be capable of communicating using this back-channel. The first device may then configure itself, the remote device, or both in order to take advantage of a shared capability. These shared capabilities may include the ability to transfer data at non-standard rates, the ability to reconfigure one or more pins to different functions, the ability to operate at non-standard voltages, or other shared capability.

In various embodiments of the present invention, contacts and other conductive portions of the connector receptacles, connector inserts, and other connecting structures may be formed by plating, depositing, stamping, metal-injection molding, machining, micro-machining, 3-D printing, or other manufacturing process. The conductive portions may be formed of stainless steel, steel, copper, copper titanium, phosphor bronze, gold, or other material or combination of materials. They may be plated or coated with nickel, gold, or other material. The nonconductive portions, such as the housings and device enclosures, may be formed using injection or other molding, 3-D printing, machining, or other manufacturing process. The nonconductive portions may be formed of silicon or silicone, rubber, hard rubber, plastic, nylon, liquid-crystal polymers (LCPs), or other nonconductive material or combination of materials. The printed circuit boards including the tongues may be formed of epoxy, FR-4, BT or other material or combination of materials. Printed circuit boards may be replaced by other substrates, such as flexible circuit boards, in many embodiments of the present invention.

Embodiments of the present invention may provide connector receptacles and connector inserts that may be located in, and may connect to, various types of devices, such as portable computing devices, tablet computers, desktop computers, laptops, all-in-one computers, wearable computing devices, cell phones, smart phones, media phones, storage devices, portable media players, navigation systems, monitors, power supplies, adapters, remote control devices, chargers, and other devices. These connector receptacles and connector inserts may provide pathways for signals that are compliant with various standards such as Universal Serial Bus (USB) including USB-C, High-Definition Multimedia Interface® (HDMI), Digital Visual Interface (DVI), Ethernet, DisplayPort, Thunderbolt™, Lightning™, Joint Test Action Group (JTAG), test-access-port (TAP), Directed Automated Random Testing (DART), universal asynchronous receiver/transmitters (UARTs), clock signals, power signals, and other types of standard, non-standard, and proprietary interfaces and combinations thereof that have been developed, are being developed, or will be developed in the future. Other embodiments of the present invention may provide connector receptacles and connector inserts that may be used to provide a reduced set of functions for one or more of these standards. In various embodiments of the present invention, these interconnect paths provided by these connector receptacles and connector inserts may be used to convey power, ground, signals, test points, and other voltage, current, data, or other information.

Various embodiments of the present invention may incorporate one or more of these and the other features described herein. A better understanding of the nature and advantages of the present invention may be gained by reference to the following detailed description and the accompanying drawings.

DESCRIPTION OF ILLUSTRATIVE EMBODIMENTS

Figure 1:
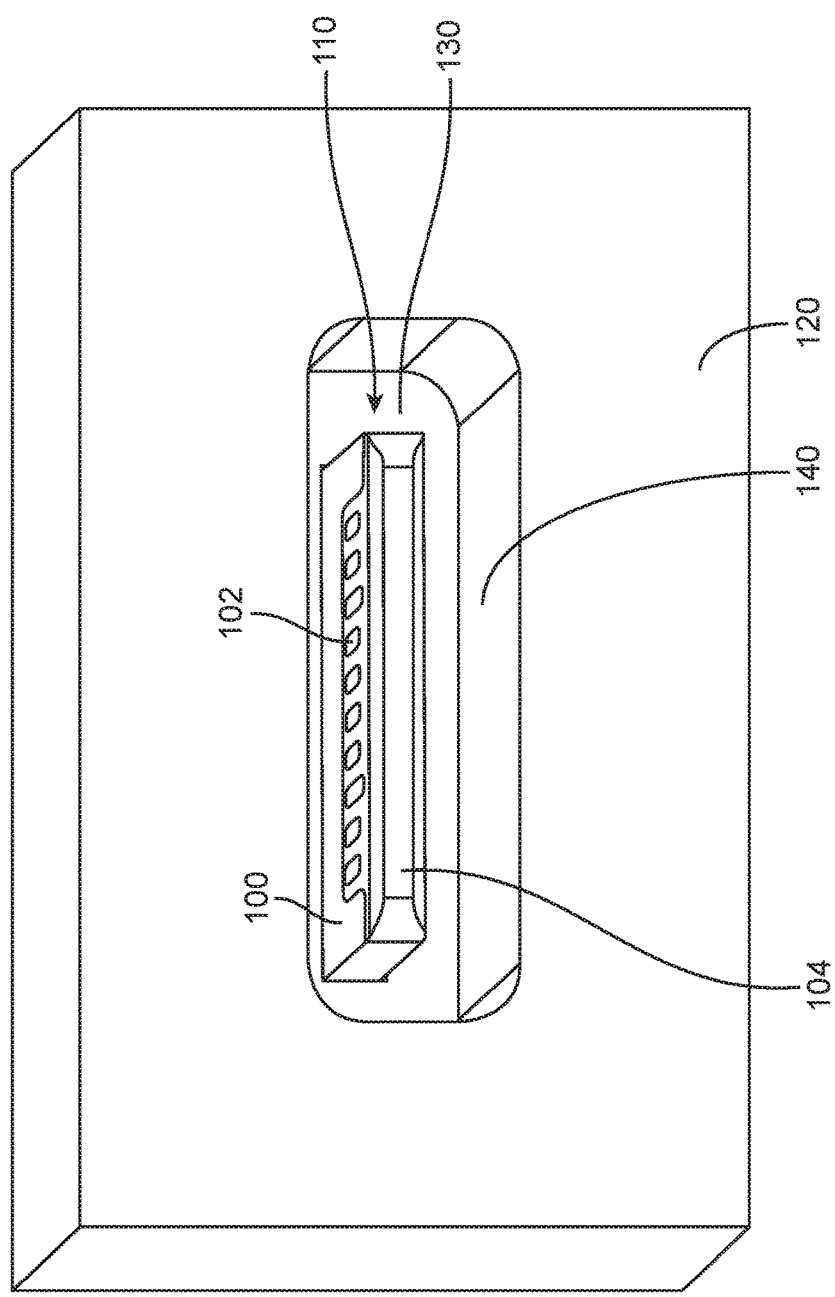
FIG. 1 illustrates a portion of an electronic device according to an embodiment of the present invention.

FIG. 1 illustrates a portion of an electronic device according to an embodiment of the present invention. This figure, as with the other included figures, is shown for illustrative purposes and does not limit either the embodiments of the present invention or the claims.

This figure includes tongue 100 located in opening 110 of an enclosure 120 for an electronic device. Opening 110 may be defined by a rear wall 130 and a sidewall 140. Tongue 100 may support a number of contacts 102 on a top and bottom side. Tongue 100 may further include front edge 104. Further details of these structures may be found in co-pending U.S. application Ser. No. 14/543,748, titled CONNECTOR RECEPTACLE HAVING A TONGUE, which is incorporated by reference.

Again, a user may want to insert a connector insert (not shown) into this or other connector receptacle. In some circumstances, this may be difficult. For example, a user may be in a darkened room, the user may have poor eyesight, or it may be difficult for other reasons. Accordingly, embodiments of the present invention may provide illumination at this connector receptacle. This illumination may facilitate the insertion of a connector insert into the connector receptacle. The illumination may be directed out of a front edge 104 of tongue 100, it may be directed to generally illuminate opening 110, or it may be directed in other ways. Examples are shown in the following figures.

Figure 2:
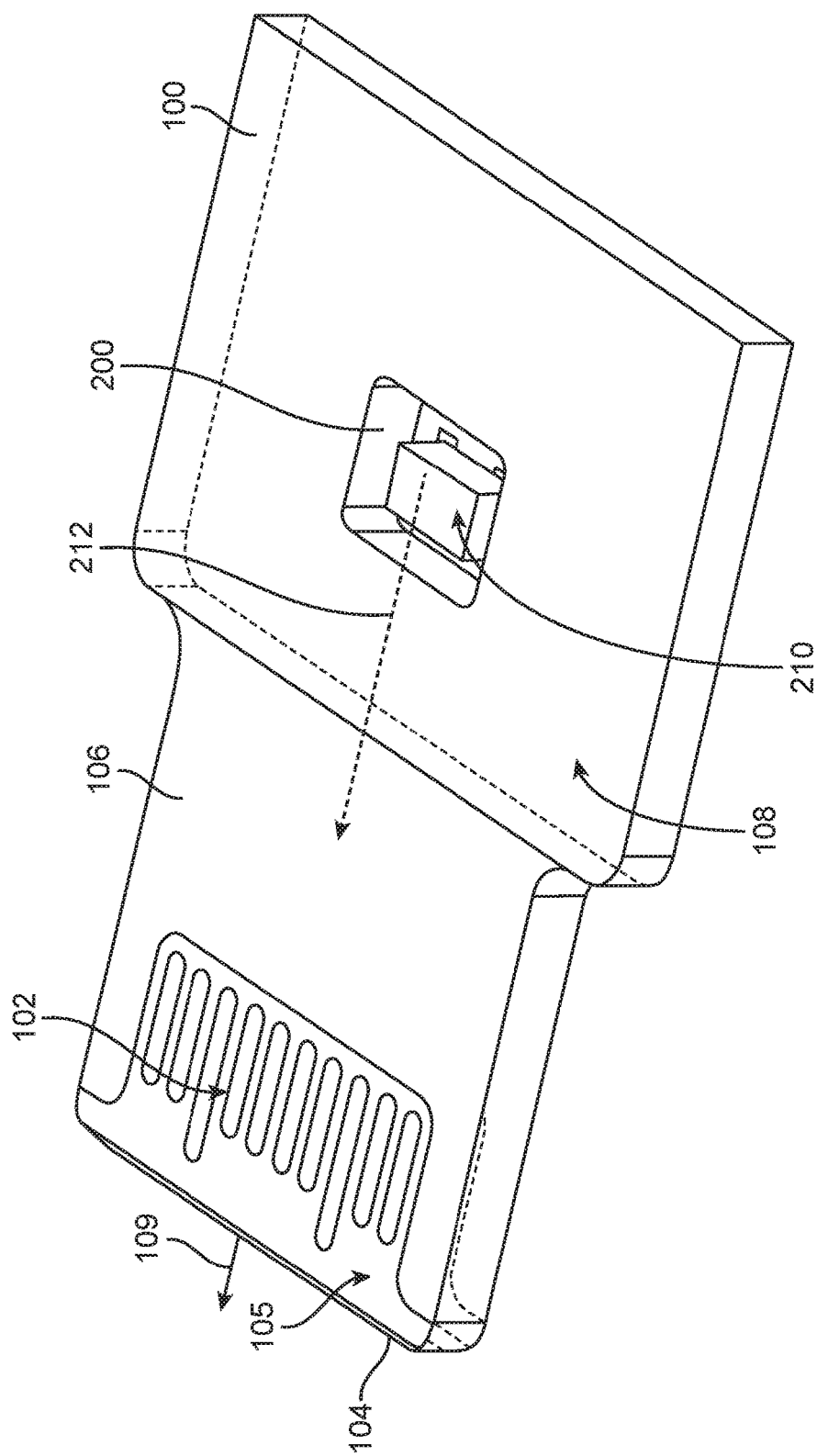
FIG. 2 illustrates a connector tongue according to an embodiment of the present invention.

FIG. 2 illustrates a connector tongue according to an embodiment of the present invention. Tongue 100 may be used as tongue 100 in a connector receptacle, such as the connector receptacle of FIG. 1, or tongue 100 may be used a tongue of a connector insert. Tongue 100 may be formed of a material that is at least partially transparent or translucent. For example, tongue 100 may be formed of an epoxy, glass fibers in an epoxy, or by using other materials. Tongue 100 may include an opening or recess 200. One or more light-emitting diodes 210 may be located in recess 200, and 210 may include or may represent one or more light-emitting diodes. Tongue 100 may further include contacts 102 and a ground plane 106. Contacts 102 and ground plane 106 may be formed of gold, copper, aluminum, or other conductive material. Solder mask regions 105 and 108 may be substantially free of a metal covering. Solder mask region 105 may allow light generated by light-emitting diode 210 to pass through a front side 104 of tongue 100.

In this configuration, light may be emitted by light-emitting diode 210 across its top surface in a direction 212 as shown. This light may be guided by the tongue 100 to front opening 104, where it may emerge in the direction 109 as shown. This light may then be visible to a user and may aid in the insertion of a connector insert into a connector receptacle, where one of the connector insert and connector receptacle employ this tongue 100.

Again, embodiments of the present invention may provide tongues formed of various materials, such as epoxy, glass fibers in epoxy, or other materials. Examples are shown in the following figures.

Figure 3:
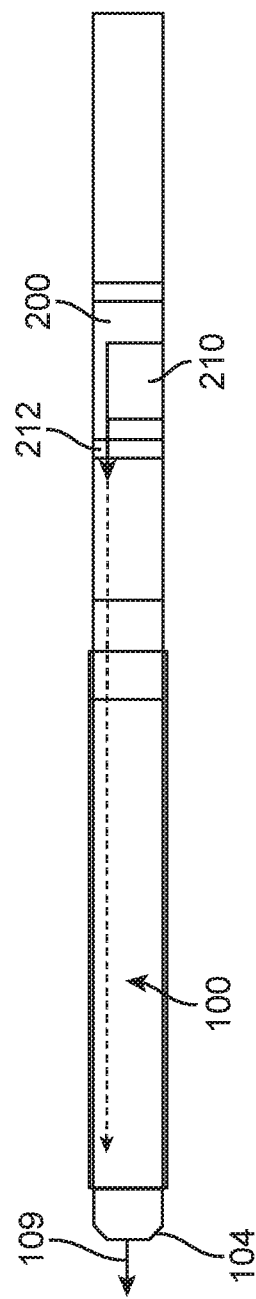
FIG. 3 illustrates a side view of the connector tongue shown in FIG. 2.

FIG. 3 illustrates a side view of the connector tongue shown in FIG. 2. Light-emitting diode 210 may be located in recess 200 in tongue 100. Tongue 100 may be formed of epoxy or other at least semi-transparent or translucent material using printed circuit board technologies. Accordingly, printed circuit board traces may be used to form electrical connections and to provide mechanical support for light-emitting diode 210. In other embodiments of the present invention, a portion of tongue 100 may remain under light-emitting diode 210 for mechanical support. Light may be emitted from light-emitting diode 210 in the direction 212 as shown. This light may pass through tongue 100 and emerge at a front end 104 in the direction 109 as shown.

Figure 4:
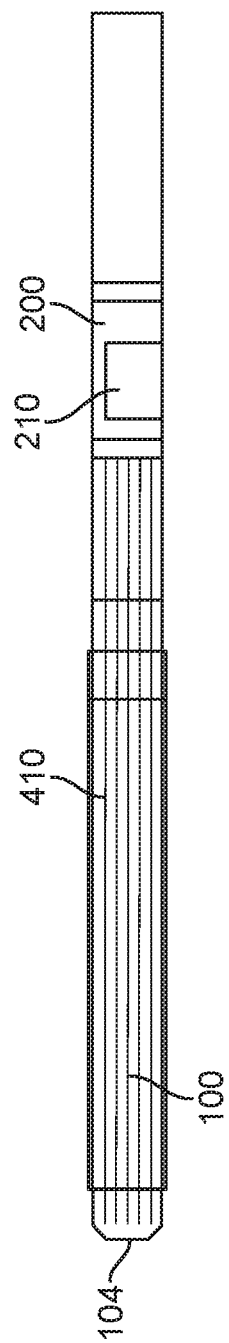
FIG. 4 illustrates an alternative side view of the connector tongue shown in FIG. 2.

FIG. 4 illustrates an alternative side view of the connector tongue shown in FIG. 2. Again, light-emitting diode 210 may be located in recess 200. Tongue 100 may be formed using glass fibers 410 in epoxy or other material. These glass fibers 410 may be aligned with each other and in a direction to guide light from light-emitting diode 210 to a front edge 104 of tongue 100.

Figure 5:
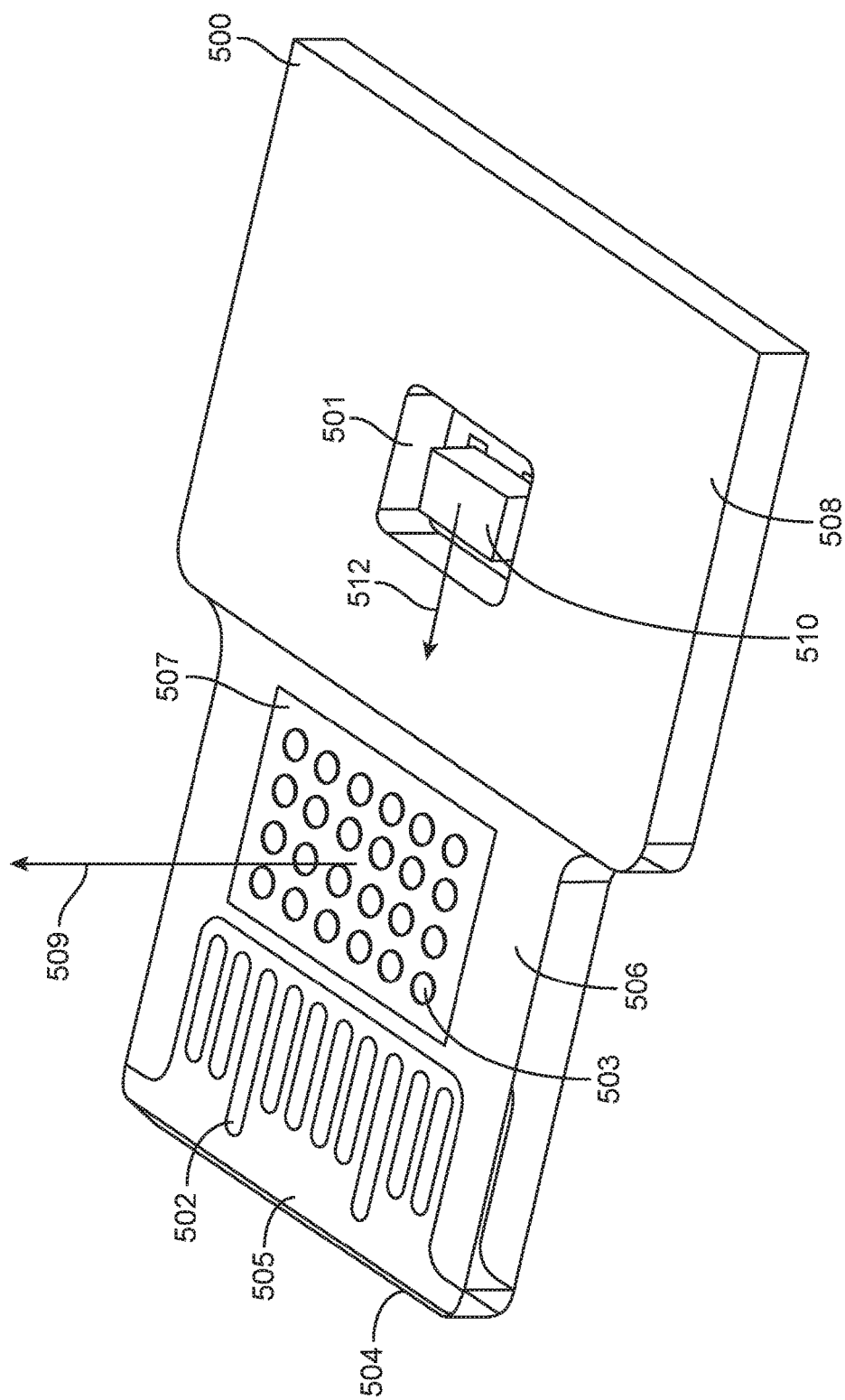
FIG. 5 illustrates a tongue for a connector according to another embodiment of the present invention.

FIG. 5 illustrates a tongue for a connector according to another embodiment of the present invention. Tongue 500 may be used as tongue 100 for a connector receptacle, such as the connector receptacle in FIG. 1, as a tongue for a connector insert, or as a tongue in other embodiments of the present invention.

Tongue 500 may be formed of a material that is at least partially transparent or translucent. For example, tongue 500 may be formed of an epoxy, glass fibers in an epoxy, or by using other materials. Tongue 500 may include an opening or recess 501. One or more light-emitting diodes 510 may be located in recess 501. Tongue 500 may further include contacts 502 and a ground plane 506. Contacts 502 and ground plane 506 may be formed of gold, copper, aluminum, or other conductive material. Solder mask region 508 may be substantially free of a metal covering. Region 505 may be at least partially covered with metal or other opaque material. A front edge 504 and other portions of region 505 may be plated to reflect light generated by light-emitting diode 510. Light reflected in this way may diffuse and emerge out of opening 507 in ground plane 506.

Specifically, tongue 500 may further include one or more openings 507 in a top, bottom, sides, or more than one top, bottom, or sides of tongue 500. Light emitted by light-emitting diode 510 may emerge from the one or more openings 507 to illuminate a connector receptacle opening, such as connector receptacle opening 110 in FIG. 1. Openings 507 may include diffusers 503 to diffuse light for a more uniform illumination of the connector receptacle opening. Where tongue 500 is part of a connector insert, light emitted by light-emitting diode 510 may emerge from the one or more openings 507 to illuminate surfaces of the connector insert. Openings 507 may include diffusers 503 to diffuse light for a more uniform illumination of the connector insert surfaces.

In this configuration, light may be emitted by light-emitting diode 510 across its top surface in a direction 512 as shown. This light may be guided by the tongue 500 to one or more openings 507, where it may emerge in the direction 509 as shown. This light may then be visible to a user and may aid in the insertion of a connector insert into a connector receptacle employing this tongue 500.

Again, embodiments of the present invention may provide tongues formed of various materials, such as epoxy, glass fibers in epoxy, or other materials. Examples are shown in the following figures.

Figure 6:
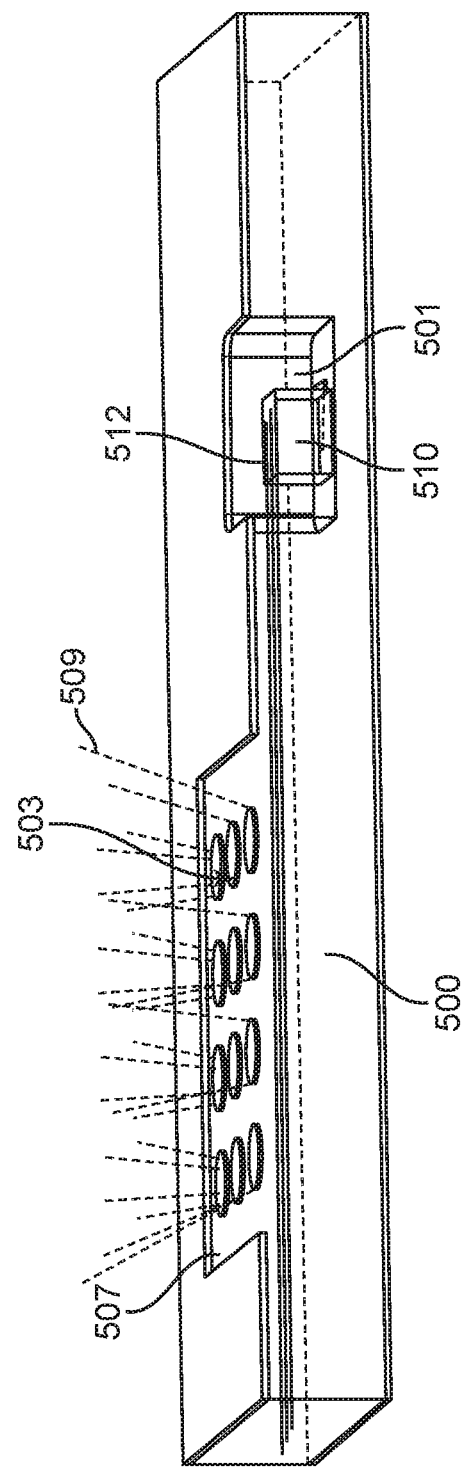
FIG. 6 illustrates a side view of the connector tongue shown in FIG. 5.

FIG. 6 illustrates a side view of the connector tongue shown in FIG. 5. Again, light-emitting diode 510 may be located in recess 501. Tongue 500 may be formed of epoxy or other at least semi-transparent or translucent material using printed circuit board technologies. Accordingly, printed circuit board traces may be used to form electrical connections and to provide mechanical support for light-emitting diode 510. In other embodiments of the present invention, a portion of tongue 500 may remain under tongue 510 for mechanical support. Light may be emitted from light-emitting diode 510 in the direction 512 as shown. This light may pass through tongue 500 and emerge at opening 507 and through diffusers 503 in the direction 509 as shown.

Figure 7:
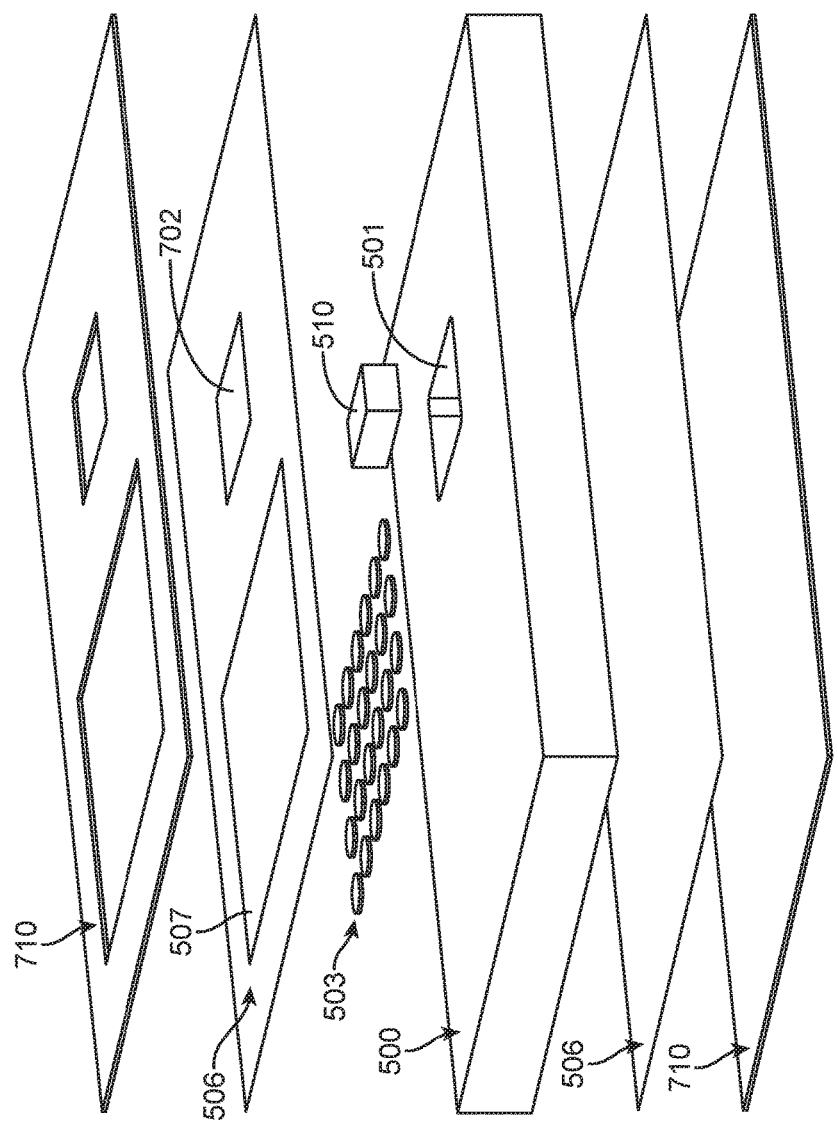
FIG. 7 illustrates the manufacturing of a portion of a connector tongue according to an embodiment of the present invention.

FIG. 7 illustrates the manufacturing of a portion of a connector tongue according to an embodiment of the present invention. A printed circuit board portion 500 may be formed. Again, this printed circuit board portion 500 may be formed of epoxy, glass fibers in epoxy, or by using other materials. An opening or recess 501 may be formed in tongue 500. Ground or copper layers 506 may be plated on top and bottom surfaces of tongue 500. An opening 702 may be located over recess 501 in the top ground or copper layer 506. One or more openings 507 may also be formed in either or both ground or copper layers 506. Glass or plastic light diffusers 503 may be placed on tongue 500. Solder mask layers 710 may be deposited for water proofing and other protection. Light-emitting diode 510 may be placed in opening 501. Conductive traces may be formed in one or more copper layers 506 to provide power, ground, or signal connections to the one or more LEDs 510 as needed.

Figure 8:
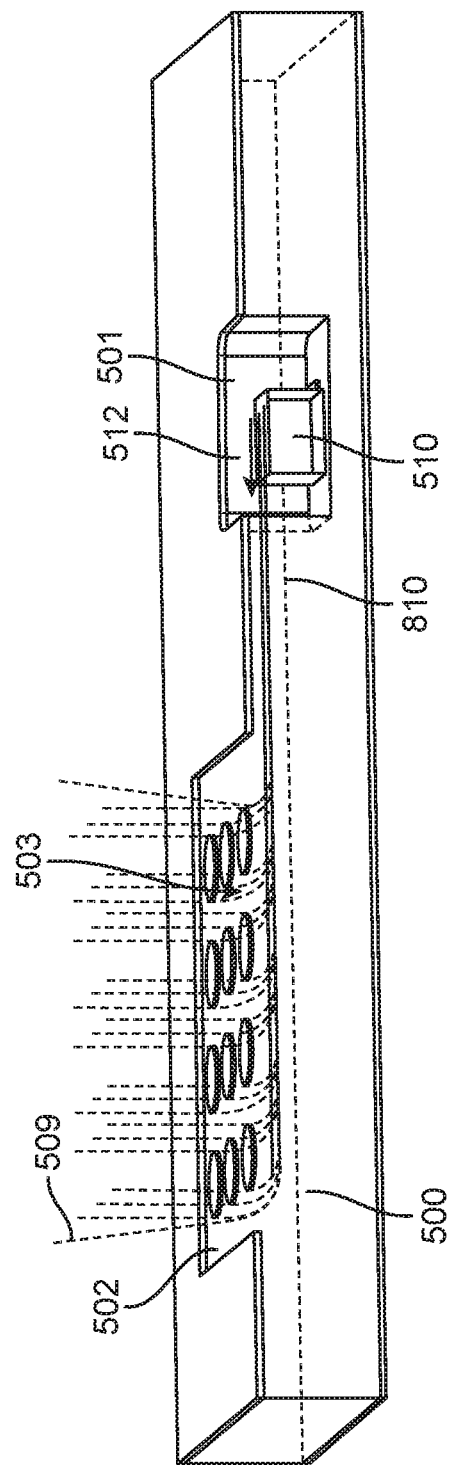
FIG. 8 illustrates an alternative side view of the connector tongue shown in FIG. 5.

FIG. 8 illustrates an alternative side view of the connector tongue shown in FIG. 5. Again, light-emitting diode 510 may be located in opening or recess 501. Tongue 500 may be formed using glass fibers 810 in epoxy or other material. These glass fibers 810 may be aligned with each other and bent or curved a direction to guide light from light-emitting diode 510 to opening 507 in ground plane 506. Again, diffusers 503 may be used to diffuse light from light-emitting diode 510.

In various embodiments of the present invention, the front or other edges of the connector tongue may be plated for aesthetic reasons, for example to form a logo or other identifying mark. Also, in various embodiments of the present invention, the illumination windows on the tongue may be similarly plated to form a logo or other identifying mark.

In these or other embodiments of the present invention, one or more LEDs may be included in, on, or proximate to a connector tongue. The illumination provided by these one or more LEDs may convey visual information to a user. The visual information may be provided to a user through the particular color of light, by a particular sequence of a light pulses, by a sequence of various colors turning off and on, or some combination thereof. For example, a particular color or pattern of light may mean that the electronic device housing the connector receptacle may have a battery that is charged above a threshold level, is presently being charged, is charged below the threshold level, or has some other charge or charging status. In this and other embodiments of the present invention, a particular color or pattern of light may mean that the electronic device is in a sleep mode, or a silent mode, or is in some other particular state.

In these and other embodiments of the present invention, it may be desirable that this information or other information be visible to a user when a connector insert is inserted into a connector receptacle. Accordingly, embodiments of the present invention may provide a connector system having a connector insert that has a light pipe to direct light from a connector receptacle tongue to an opening in the connector insert housing. Light from the connector receptacle tongue may then be visible to a user. In this way, charging information, status information, or other information provided by the electronic device on the connector receptacle tongue may be visible to a user when a connector insert is inserted into the connector receptacle. In a specific embodiment of the present invention, circuitry in the electronic device may detect that a connector insert has been mated with the connector receptacle. The circuitry may drive the one or more LEDs to a color or pattern that indicates the connector insert has been mated to the connector receptacle. This may then be visible to a user to confirm that a connection has been made. Examples of such a connector system are shown in the following figures.

Figure 9:
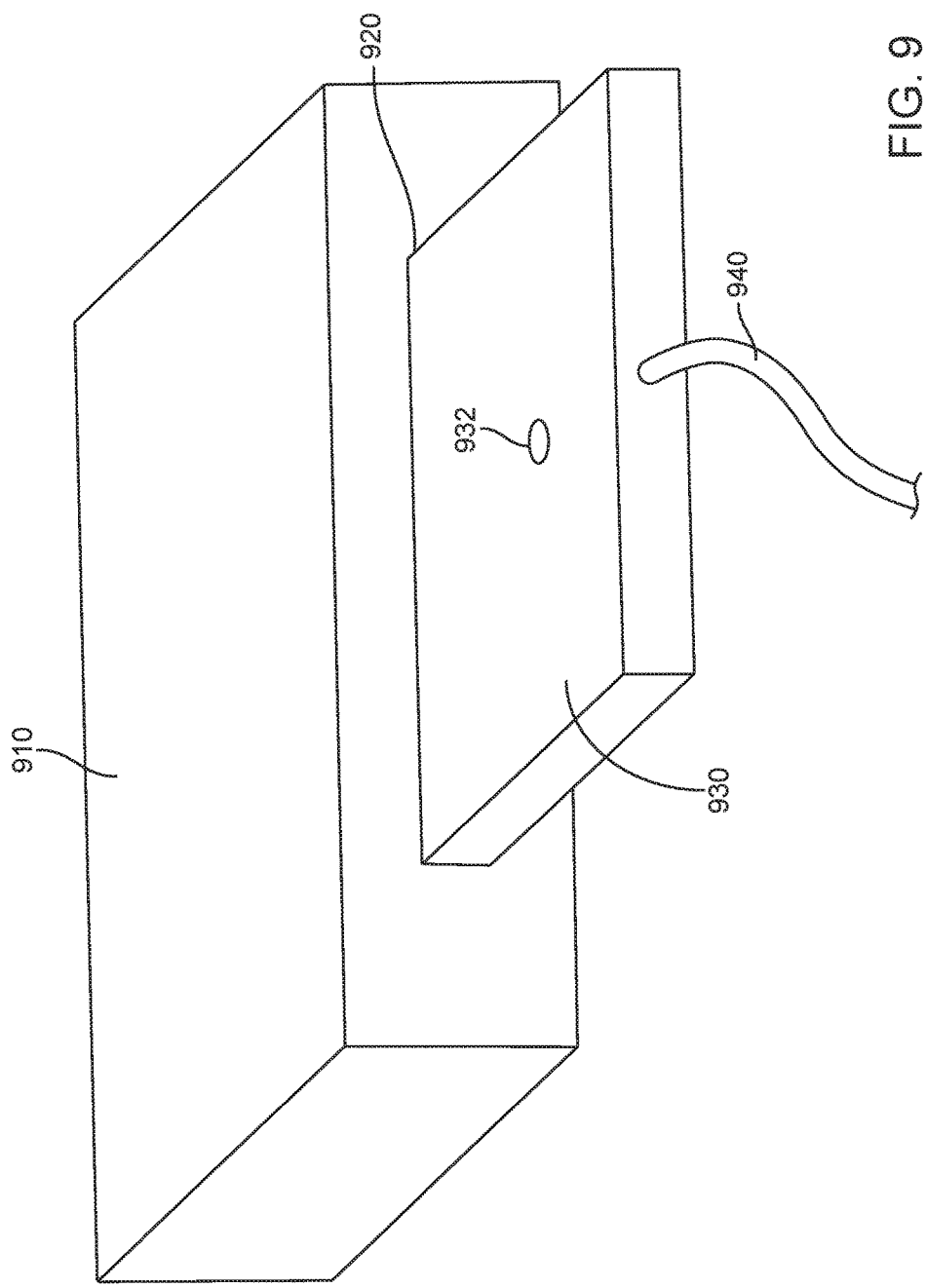
FIG. 9 illustrates an electronic system according to an embodiment of the present invention.

FIG. 9 illustrates an electronic system according to an embodiment of the present invention. This figure includes an electronic device 910 having a connector receptacle 920. Connector insert 930 may be inserted into connector receptacle 920. Opening 932 may be formed in a housing of connector insert 930 and may provide an exit for light generated on a tongue in connector receptacle 920. Connector insert 930 may be connected to a similar connector insert at a remote end of cable 940. In other embodiments of the present invention, an opening on electronic device 910 may provide an exit for light generated on a tongue of connector insert 930.

Figure 10:
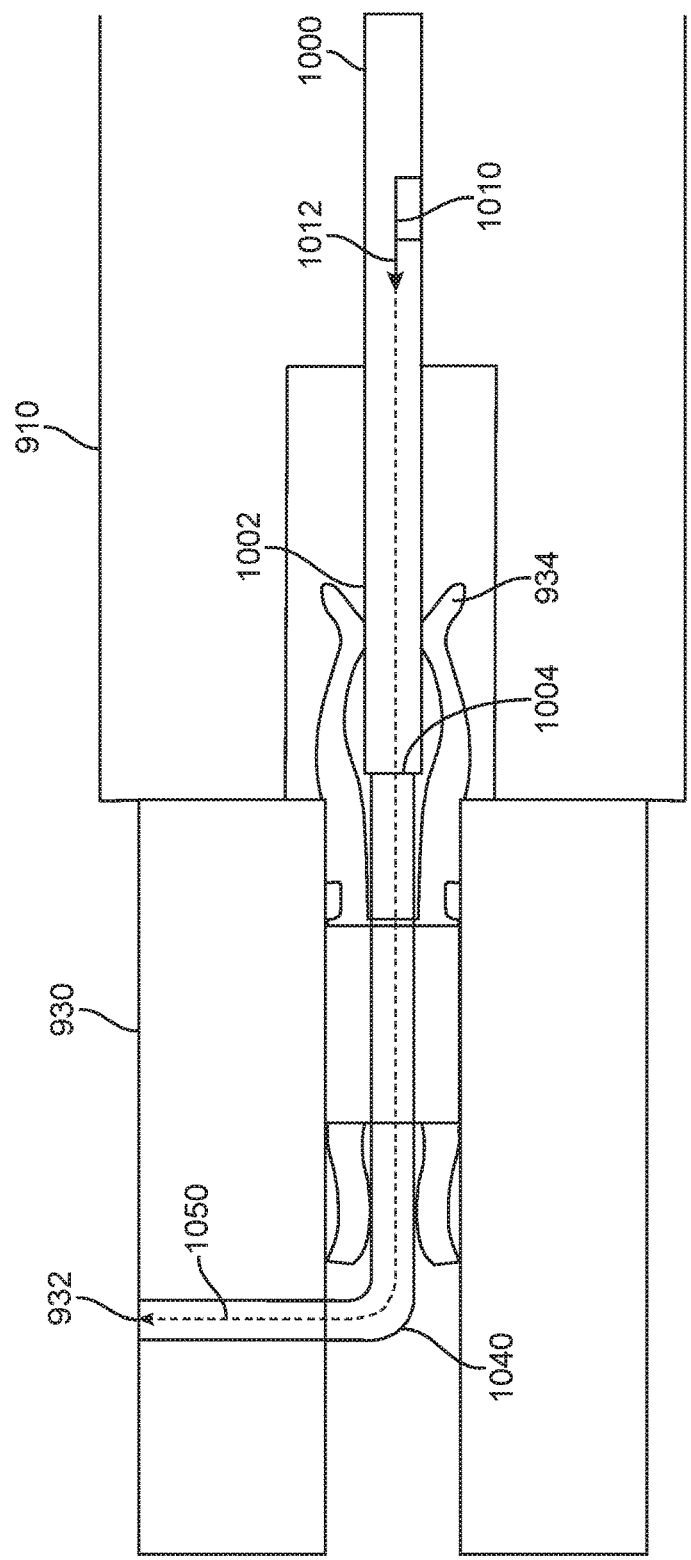
FIG. 10 illustrates a side view of the electronic system of FIG. 9.

FIG. 10 illustrates a side view of the electronic system of FIG. 9. Electronic device 910 may include a tongue 1000. Tongue 1000 may support one or more light-emitting diodes 1010, and 1010 may include or may represent one or more light-emitting diodes. The one or more light-emitting diodes 1010 may generate light in a direction 1012 as shown. This light may pass through the end 1004 of tongue 1000 and enter light pipe 1040 in connector insert 930. Light pipe 1040 may direct this light to opening 932 or it may emerge in the direction 1050 as shown. The light generated by light-emitting diodes 1010 may then be visible to a user even though the connector receptacle 920 is covered by connector insert 930. Contacts 934 may form electrical connections with contacts 1002 on a surface of tongue 1000. In other embodiments of the present invention, the flow of light may be reversed. That is, tongue 1000 may be in connector insert 930 and opening 932 may be on device 910.

In these and other embodiments of the present invention, other types of data may be conveyed using this or similar connector systems. For example, authentication, identification, or other types of information or data may be transmitted between an electronic device housing the connector receptacle and a remote circuit. The remote circuit may be located in a connector insert that is inserted into the connector receptacle, a connector insert at a far end of a cable attached to the connector insert, or in a device connected to the electronic device through such a cable. In one specific example, the connector receptacle may be a connector receptacle for a standardized interface, such as a Universal Serial Bus (USB) interface including USB-C. The light path through the connector system may be an optional back-channel data path for devices made by a particular manufacturer or group of manufacturers. Again, data such as authentication, identification, or other types of information or data may be transmitted between devices made by a particular manufacturer or group of manufacturers. In these and other embodiments of the present invention, a first device may recognize that a remote device may be capable of communicating using this back-channel. The first device may then configure itself, the remote device, or both in order to take advantage of a shared capability. These shared capabilities may include the ability to transfer data at non-standard rates, the ability to reconfigure one or more pins to different functions, the ability to operate at non-standard voltages, or other shared capability.

Figure 11:
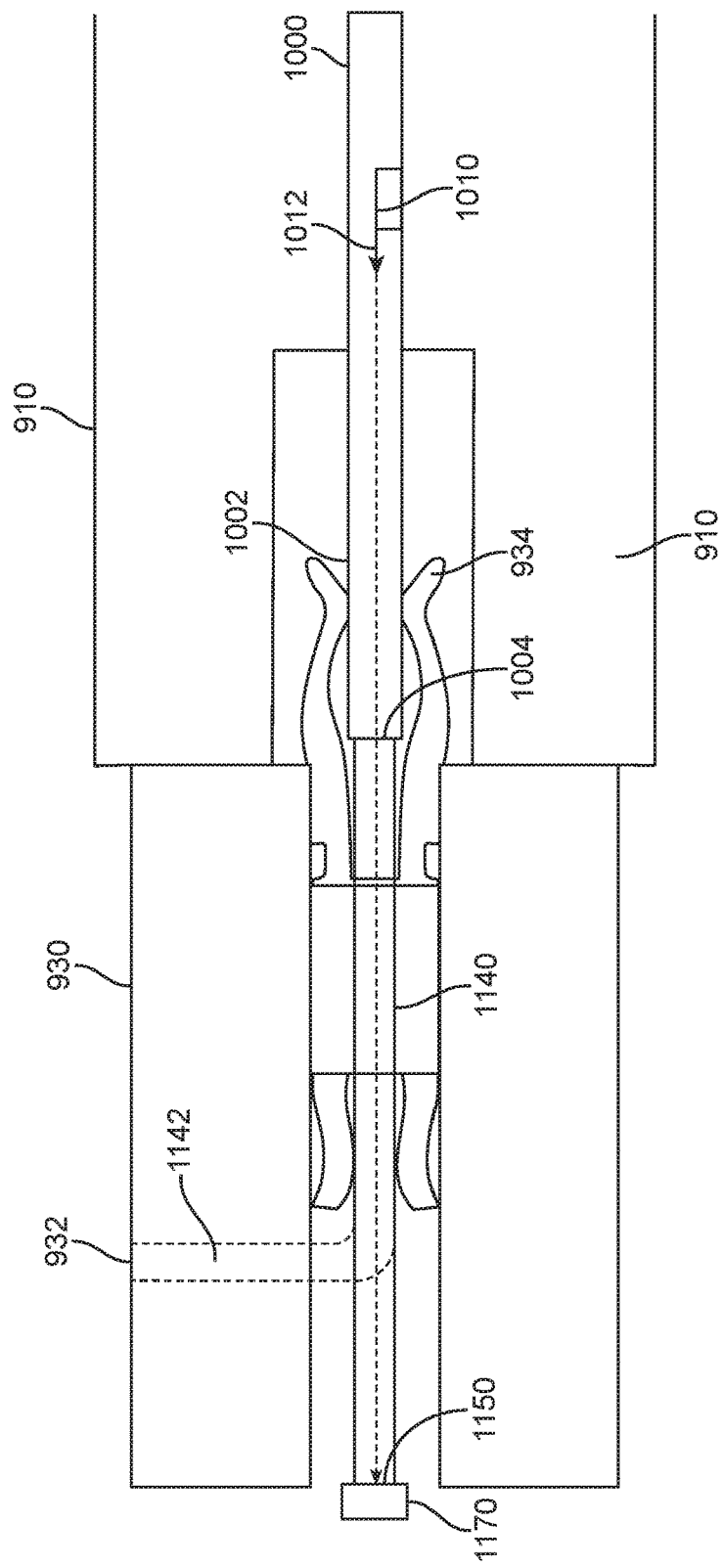
FIG. 11 illustrates an alternative side view of the electronic system of FIG. 9.

FIG. 11 illustrates an alternative side view of the electronic system of FIG. 9. Electronic device 910 may include a tongue 1000. Tongue 1000 may support one or more light-emitting diodes 1010. Light-emitting diodes 1010 may generate light in a direction 1012 as shown. This light may pass through the end 1004 of tongue 1000 and enter light pipe 1040 in connector insert 930. Light pipe 1040 may direct this light to a photo diode or other circuit or component 1170. The photo diode may then convert received optical energy from the one or more light-emitting diodes 1010 on tongue 1000 into electrical signals. These electrical signals may then be conveyed using conductors in cable 940 (shown in FIG. 9) to a second device or a second connector insert (not shown.) The light may optionally be split such that it may emerge from opening 932 as before as well as proceeding in direction 1150 to photodiode or other circuit or component 1170. A reverse path (not shown) from circuits 1170 to a photodiode (not shown) near light-emitting diodes 1010 may also be included. In these and other embodiments of the present invention, photodiode or other electrical component 1170 may be changed or omitted such that fiber optic line 1140 extends through the cable 940 (as shown in FIG. 9). In these ways, signals may be passed from the connector insert 930 to the electronic device 910. Contacts 934 may form electrical connections with contacts 1002 on a surface of tongue 1000.

In various embodiments of the present invention, contacts and other conductive portions of the connector receptacles, connector inserts, and other connecting structures may be formed by plating, depositing, stamping, metal-injection molding, machining, micro-machining, 3-D printing, or other manufacturing process. The conductive portions may be formed of stainless steel, steel, copper, copper titanium, phosphor bronze, gold, or other material or combination of materials. They may be plated or coated with nickel, gold, or other material. The nonconductive portions, such as the housings and device enclosures, may be formed using injection or other molding, 3-D printing, machining, or other manufacturing process. The nonconductive portions may be formed of silicon or silicone, rubber, hard rubber, plastic, nylon, liquid-crystal polymers (LCPs), or other nonconductive material or combination of materials. The printed circuit boards including the tongues may be formed of epoxy, FR-4, BT or other material or combination of materials. Printed circuit boards may be replaced by other substrates, such as flexible circuit boards, in many embodiments of the present invention.

Embodiments of the present invention may provide connector receptacles and connector inserts that may be located in, and may connect to, various types of devices, such as portable computing devices, tablet computers, desktop computers, laptops, all-in-one computers, wearable computing devices, cell phones, smart phones, media phones, storage devices, portable media players, navigation systems, monitors, power supplies, adapters, remote control devices, chargers, and other devices. These connector receptacles and connector inserts may provide pathways for signals that are compliant with various standards such as Universal Serial Bus (USB) including USB-C, High-Definition Multimedia Interface® (HDMI), Digital Visual Interface (DVI), Ethernet, DisplayPort, Thunderbolt™, Lightning™, Joint Test Action Group (JTAG), test-access-port (TAP), Directed Automated Random Testing (DART), universal asynchronous receiver/transmitters (UARTs), clock signals, power signals, and other types of standard, non-standard, and proprietary interfaces and combinations thereof that have been developed, are being developed, or will be developed in the future. Other embodiments of the present invention may provide connector receptacles and connector inserts that may be used to provide a reduced set of functions for one or more of these standards. In various embodiments of the present invention, these interconnect paths provided by these connector receptacles and connector inserts may be used to convey power, ground, signals, test points, and other voltage, current, data, or other information.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. A tongue of an electrical connector, the tongue comprising:
a light-emitting diode;
a first plurality of contacts on a top side of the tongue, each to form an electrical connection with a corresponding contact of a corresponding connector when the corresponding connector and the electrical connector are mated; and
a second plurality of contacts on a bottom side of the tongue, each to form an electrical connection with a corresponding contact of the corresponding connector when the corresponding connector and the electrical connector are mated,
wherein the tongue forms a light guide from the light-emitting diode to a front edge of the tongue such that light provided by the light-emitting diode passes below the first plurality of contacts and above the second plurality of contacts, the light exiting through the front edge of the tongue,
wherein the tongue is arranged to fit in an opening in the corresponding connector when the corresponding connector and the electrical connector are mated, and
wherein the light-emitting diode is located on the tongue.

2. The tongue of an electrical connector of claim 1 wherein the tongue further comprises a recess, the light-emitting diode in the recess.

3. The tongue of an electrical connector of claim 2 wherein the first plurality of contacts are formed between the front edge of the tongue and the recess.

4. The tongue of an electrical connector of claim 3 wherein the tongue is formed as a portion of a printed circuit board.

5. The tongue of an electrical connector of claim 4 wherein the portion of the printed circuit board is formed of epoxy.

6. The tongue of an electrical connector of claim 4 wherein the portion of the printed circuit board comprises a plurality of glass fibers aligned to guide light from the light-emitting diode to the front edge of the tongue.

7. The tongue of an electrical connector of claim 1 wherein the light-emitting diode is one of a plurality of light-emitting diodes, and the plurality of light-emitting diodes may be selectively activated to convey information to a user.

8. The tongue of an electrical connector of claim 1 wherein the front edge of the tongue is partially plated.

9. A tongue of an electrical connector, the tongue comprising:
   a plated layer over a front edge of the tongue;
   a light-emitting diode;
   a first plurality of contacts on a top side of the tongue;
   a second plurality of contacts on a bottom side of the tongue; and
   a first illumination window on a top side of the tongue,
   wherein the tongue forms a light guide from the light-emitting diode to a front edge of the tongue such that a first portion of light provided by the light-emitting diode passes below the first plurality of contacts and above the second plurality of contacts and a second portion of light provided by the light-emitting diode exits the first illumination window,
   wherein the plated layer reflects the first portion of light such that the first portion of light exists the first illumination window, and
   wherein the light-emitting diode is located on the tongue.

10. The tongue of an electrical connector of claim 9 wherein the tongue further comprises a recess, the light-emitting diode in the recess.

11. The tongue of an electrical connector of claim 10 wherein the first illumination window is located between the first plurality of contacts and the recess.

12. The tongue of an electrical connector of claim 11 wherein the tongue is formed as a portion of a printed circuit board.

13. The tongue of an electrical connector of claim 12 wherein the portion of the printed circuit board is formed of epoxy.

14. The tongue of an electrical connector of claim 12 wherein the portion of the printed circuit board comprises a plurality of glass fibers aligned to guide light from the light-emitting diode to the first illumination window.

15. The tongue of an electrical connector of claim 9 wherein the light-emitting diode is one of a plurality of light-emitting diodes, and the plurality of light-emitting diodes may be selectively activated to convey information to a user.

16. The tongue of an electrical connector of claim 9 wherein the tongue further comprises a second illumination window on a bottom side of the tongue.

17. An electrical connector system comprising:
   an electrical connector receptacle comprising a tongue, the tongue comprising:
      a light-emitting diode on the tongue;
      a first plurality of contacts on a top side of the tongue; and
      a second plurality of contacts on a bottom side of the tongue,
      wherein the tongue forms a first light guide from the light-emitting diode to a front edge of the tongue such that light provided by the light-emitting diode passes between the first plurality of contacts and the second plurality of contacts, and
   an electrical connector insert comprising:
      a housing;
      a first plurality of contacts in the housing, each to form an electrical connection with a corresponding contact in the first plurality of contacts on the electrical connector receptacle tongue when the electrical connector insert and electrical connector receptacle are mated;
      a second plurality of contacts in the housing, each to form an electrical connection with a corresponding contact in the second plurality of contacts on the electrical connector receptacle tongue when the electrical connector insert and electrical connector receptacle are mated; and
      a second light guide between the first plurality of contacts and the second plurality of contacts to receive light from the light-emitting diode via the tongue.

18. The electrical connector system of claim 17 wherein the second light guide in the electrical connector insert guides light to an opening in the housing of the electrical connector insert.

19. The electrical connector system of claim 18 wherein the light-emitting diode is one of a plurality of light-emitting diodes, and the plurality of light-emitting diodes may be selectively activated to convey information to a user.

20. The electrical connector system of claim 17 wherein the second light guide in the electrical connector insert guides light to a photodetector.

21. The electrical connector system of claim 20 wherein the photodetector is in one of the electrical connector insert or a remote electronic device connected to the electrical connector insert via a cable.

\* \* \* \* \*